(12) United States Patent  (10) Patent No.: US 7,131,767 B2
Socci et al.  (45) Date of Patent: Nov. 7, 2006

(54) ELECTRONIC MODULE WITH BUILT-IN TEMPERATURE DISPLAY

(75) Inventors: Christopher Socci, Rahway, NJ (US); Robert Wavra, Flemington, NJ (US); Luis Fukazawa, Cranford, NJ (US)

(73) Assignee: PNY Technologies, Inc., Parsippany, NJ (US)

( * ) Notice: Subject to any disclaimer, the term of this patent is extended or adjusted under 35 U.S.C. 154(b) by 0 days.

(21) Appl. No.: 10/930,707

(22) Filed: Aug. 31, 2004

(65) Prior Publication Data

US 2006/0045168 A1  Mar. 2, 2006

(51) Int. Cl.
*G01K 1/14* (2006.01)
(52) U.S. Cl. .................... 374/152; 365/211
(58) Field of Classification Search ............... 374/152, 374/170; 365/211; 702/132
See application file for complete search history.

(56) References Cited

U.S. PATENT DOCUMENTS

| | | | | |
|---|---|---|---|---|
| 5,115,225 A | * | 5/1992 | Dao et al. ................ 340/584 |
| 5,214,762 A | | 5/1993 | Bush et al. ................ 710/17 |
| 5,230,055 A | * | 7/1993 | Katz et al. ............... 702/132 |
| 5,355,121 A | * | 10/1994 | Naito et al. .............. 340/584 |
| 5,611,057 A | * | 3/1997 | Pecone et al. ........... 710/301 |
| 5,623,691 A | | 4/1997 | Clohset et al. ............. 710/1 |
| 5,761,527 A | | 6/1998 | Clohset et al. ............. 710/1 |
| 5,954,827 A | * | 9/1999 | Frank et al. .............. 714/48 |
| 6,021,076 A | * | 2/2000 | Woo et al. ............... 365/211 |
| 6,065,138 A | | 5/2000 | Gould et al. .............. 714/47 |
| 6,092,926 A | * | 7/2000 | Still et al. ............... 374/141 |
| 6,101,459 A | * | 8/2000 | Tavallaei et al. ........... 702/132 |
| 6,219,723 B1 | | 4/2001 | Hetherington et al. ....... 710/18 |
| 6,360,285 B1 | | 3/2002 | Fenwick et al. ........... 710/17 |
| 6,388,878 B1 | * | 5/2002 | Chang .................... 702/132 |
| 6,453,218 B1 | * | 9/2002 | Vergis ................... 365/211 |
| 6,487,613 B1 | | 11/2002 | Nguyen et al. ........... 710/15 |
| 6,661,655 B1 | * | 12/2003 | Yin ..................... 361/687 |
| 6,662,136 B1 | | 12/2003 | Lamb et al. .............. 702/132 |
| 6,826,456 B1 | * | 11/2004 | Irving et al. ............. 702/132 |
| 2003/0176985 A1 | | 9/2003 | Chen .................... 702/132 |
| 2003/0216882 A1 | | 11/2003 | Lai et al. ............... 702/132 |

OTHER PUBLICATIONS

Data Sheet of Corsair CMX512-4000PRO DDR Module, (Sep. 2003).
Press Release dated Sep. 16, 2003 of Corsair XMS ProSeries DDR Modules.
Maxim Integrated Products, Inc., "Maxim Dual Trip SOT Temperature Switches (MAX6505-MAX6508)", 19-1712; Rev. 1; Apr. 2000 (10 pages).

* cited by examiner

*Primary Examiner*—G. Bradley Bennett
(74) *Attorney, Agent, or Firm*—McCarter & English, LLP

(57) ABSTRACT

An electronic device includes at least one electronic component and a temperature sensor located adjacent the electronic component for sensing a temperature condition of the electronic component. A display is provided for electronically displaying the temperature condition sensed by the sensor. The electronic component, the sensor and the display are integrated with one another as a single, self-contained module. In accordance with one feature of the present invention, the electronic component includes at least one memory circuit for storing data therein.

37 Claims, 12 Drawing Sheets

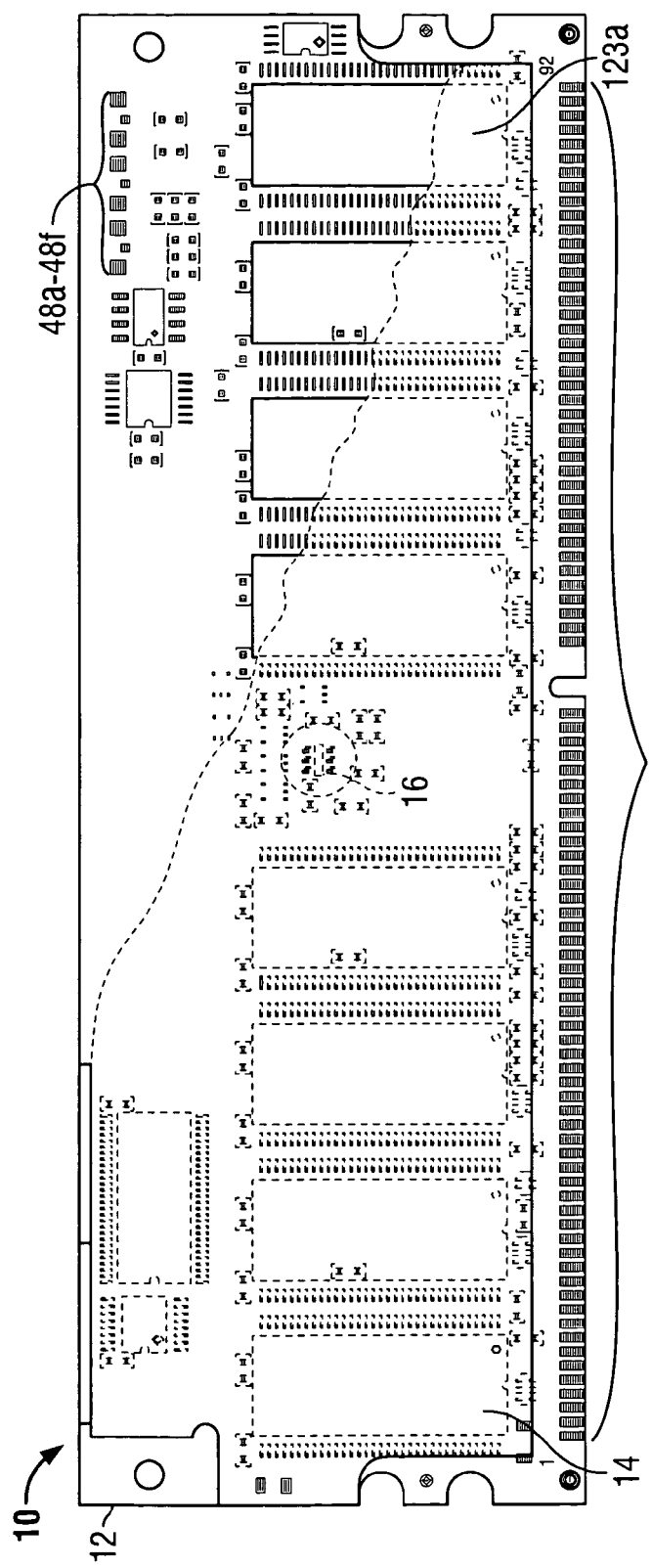
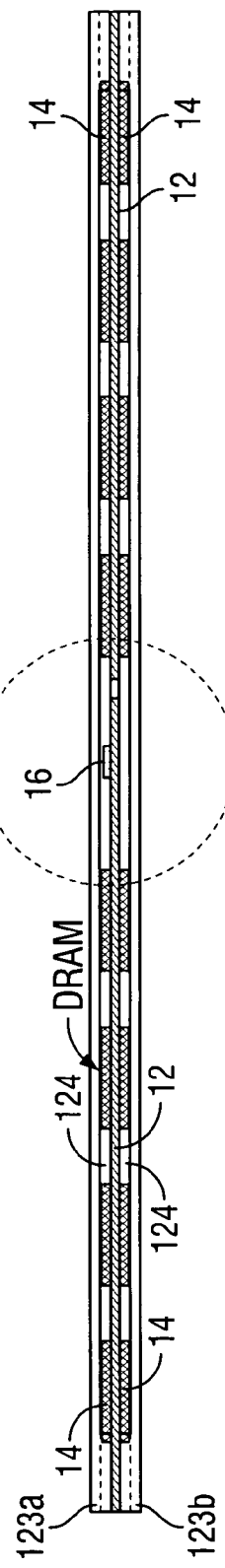
FIG. 3
FIG. 4

ELECTRONIC MODULE WITH BUILT-IN TEMPERATURE DISPLAY

FIELD OF THE INVENTION

The present invention relates to electronic modules and, more particularly, to an electronic module with an integrated or built-in temperature sensor and display.

BACKGROUND OF THE INVENTION

Electronic modules come in many different forms (e.g., computer motherboards, plug-in printed circuit boards, single in-line memory modules (SIMM) and dual in-line memory modules (DIMM)). These modules typically contain solid-state silicon memory such as non-volatile static random access memory and different types of volatile dynamic random access memory (DRAM, SDRAM). One problem that occurs with static or dynamic random access memory is that they consume much power and thereby generate undesirable heat when operated at higher than their normal operating frequencies. If no action is taken to dissipate the heat, then the memory can sustain damage.

Excessive heat generation is especially problematic for a class of users of computer systems known as the "power users" or "game enthusiasts". These users often remove the case of their personal computer so that the internal processor and memory sub-system (e.g., DRAM modules) connected thereto can be observed directly. This is necessary, as the "power users" or "game enthusiasts" run their systems at or beyond the upper boundaries of the intended frequency and voltage parameters in order to maximize performance. Because the primary undesired side effect of higher voltages and clock frequencies is potentially damaging heat, it is desirable to monitor and regulate the temperature of computer systems' memory modules to prevent performance degradation, errors and/or failure.

U.S. Pat. No. 6,662,136 to Lamb et al. (hereinafter "the Lamb patent") discloses a memory sub-system equipped with a digital temperature sensor to monitor the temperature in a memory unit contained therein. More particularly, the memory unit is provided with a number of integrated circuits placed on a printed circuit board that is to be inserted into an available interface card slot of the computer system. While the digital temperature sensor is adapted to operate on-board circuitry for controlling the speed of an external fan in response to sensed temperature being above a predetermined level, the memory sub-system is not adapted to visually display the temperature condition of the memory unit.

SUMMARY OF THE INVENTION

The disadvantages and shortcomings of the prior art discussed above are overcome by the present invention by providing an electronic device including at least one electronic component and a temperature sensor which is located adjacent the electronic component for sensing a temperature condition of the electronic component. A display is provided for electronically displaying the temperature condition sensed by the sensor. The electronic component, the sensor and the display are integrated with one another as a single, self-contained module. In accordance with one feature of the present invention, the electronic component includes at least one memory circuit for storing data therein.

BRIEF DESCRIPTION OF THE DRAWINGS

For a more complete understanding of the present invention, reference is made to the following detailed description of exemplary embodiments considered in conjunction with the accompanying drawings, in which:

FIG. 3 is a top plan view of the electronic module shown in FIG. 1;

FIG. 4 is a front view of the electronic module shown in FIG. 3;

DETAILED DESCRIPTION OF THE INVENTION

Although the present invention can be used in conjunction with any type of electronic module, it is particularly suitable for use in connection with a memory module adapted for use with personal computers (e.g., DRAM modules adapted to be plugged in interface card slots). Accordingly, the present invention will be described hereinafter in connection with such a memory module. It should be understood, however, that the following description is only meant to be illustrative of the present invention and is not meant to limit the scope of the present invention, which has applicability to other types of electronic modules, such as graphics card and other personal computer cards.

Figure 1:
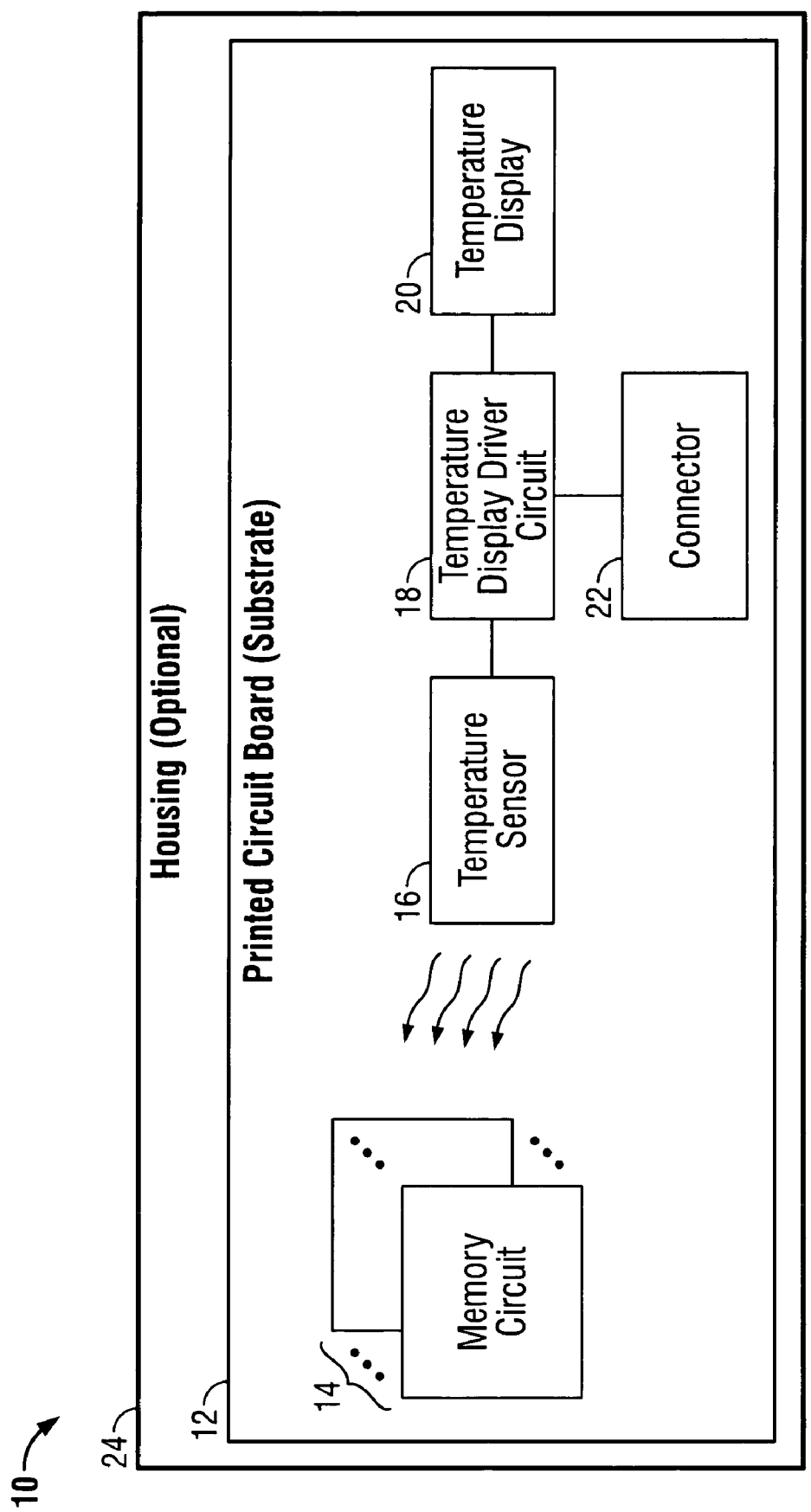
FIG. 1 is a block diagram of an electronic module constructed in accordance with a first exemplary embodiment of the present invention.

With reference to FIG. 1, there is shown a memory module 10 constructed in accordance with a first embodiment of the present invention. More particularly, the memory module 10 includes a substrate 12 (e.g., a printed circuit board substrate). On the substrate 12 are mounted electronic/electrical components, including memory circuits 14, a temperature sensor 16, a temperature display driver circuit 18, a temperature display 20, and a connector 22. Optionally, a housing 24 can be provided for housing or encasing the printed circuit board substrate 12, as well as the electronic/electrical components mounted thereon. The temperature sensor 16 is thermally coupled to the memory circuits 14 for monitoring or sensing the temperature of the memory circuits 14. The temperature sensor 16 is electrically connected to the temperature display driver circuit 18 for sending an electrical signal thereto. The temperature display 20 is electrically connected to the temperature display driver circuit 18 for receiving an electrical signal processed by the temperature display driver circuit 18 and displaying the temperature condition of the memory module 10 (i.e., the memory circuits 14).

Still referring to FIG. 1, the memory circuits 14 are mounted on the printed circuit board substrate 12. Each of the memory circuits 14 can be any type of memory circuit (e.g., static or dynamic random access memory integrated circuits) and operates in a conventional manner.

Figure 2:
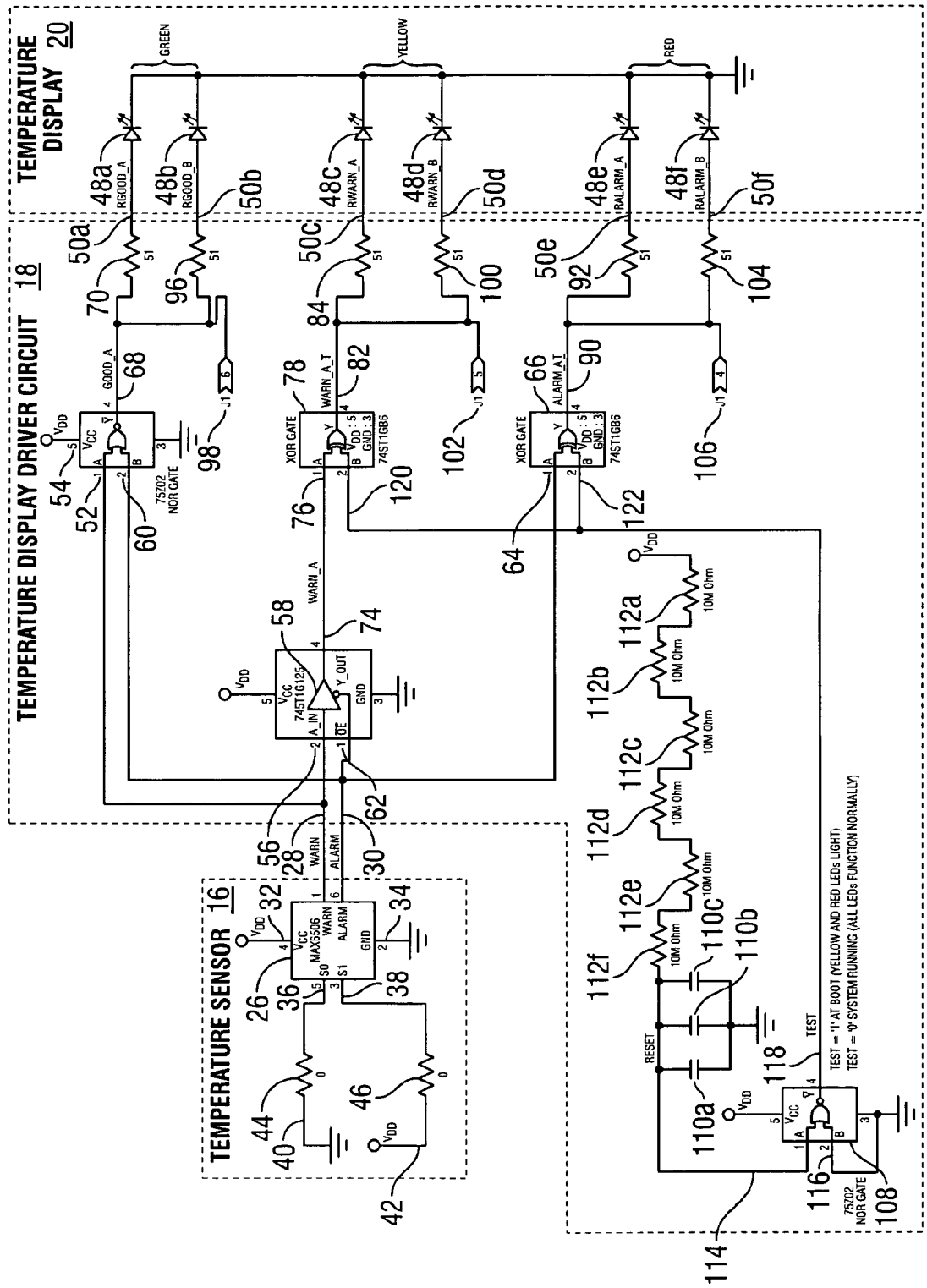
FIG. 2 is an electronic schematic diagram of the electronic module shown in FIG. 1.

FIG. 2 schematically illustrates electronic elements of the temperature sensor 16, the temperature display driver circuit 18, and the temperature display 20. More particularly, the temperature sensor 16 includes a temperature sensor integrated circuit 26. While the temperature sensor integrated circuit 26 can be any type of conventional temperature sensor circuit unit, a temperature sensor integrated circuit unit sold by Maxim Integrated Products as part number MAX6506 is particularly suitable for use in conjunction with the present invention. In such circumstances, the temperature sensor 16 will be discussed hereinafter in connection with the MAX6506 temperature sensor unit with the understanding that other types of temperature sensor integrated circuits can be utilized.

With continued reference to FIG. 2, the temperature sensor integrated circuit 26 has a pair of outputs 28 and 30 labeled "WARN" and "ALARM", respectively, a power supply input 32 and a ground potential input 34, and threshold temperature control inputs 36 and 38 which are labeled in FIG. 2 as "S0" and "S1", respectively. When the temperature sensed by the temperature sensor integrated circuit 26 exceeds a first preset threshold value (referred to hereinafter as "the WARN threshold") (e.g., 55° C.), the WARN output 28 goes from a low logic state to a high logic state. When the temperature sensed by the temperature sensor integrated circuit 26 exceeds a second preset threshold value (referred to hereinafter as "the ALARM threshold") (e.g., 65° C.) which is greater than the first threshold value, the ALARM output 30 goes from a low logic state to a high logic state, while the WARN output 28 remains in its high logic state. The WARN output 28 and the ALARM output 30 are adapted to drive the temperature display driver circuit 24 as will be discussed in detail hereinafter.

The temperature sensor integrated circuit 26 is preprogrammed to have the temperature threshold of the ALARM output 30 set to a predetermined value (e.g., between −40° C. and +125° C.). In the embodiment illustrated in FIG. 2, an input 40 is tied to the ground potential input 34 via a resistor 44, while an input 42 is tied to the power supply input 32 via a resistor 46 so that a "high" logic level on the WARN output 28 corresponds to a preset temperature difference (e.g., 10° C.) between the WARN threshold and the ALARM threshold. For instance, if the temperature sensor integrate circuit 26 is preprogrammed to have an ALARM threshold of about 65° C., then the WARN threshold is set to about 55° C.

The relative difference between the temperature threshold of the WARN threshold and the ALARM threshold is set by the voltages appearing at the inputs 36 and 38. The inputs 40 and 42 can be tied to either the power supply voltage of the power supply input 32 or the ground potential voltage of the ground potential input 34 via approximately 0 ohm resistors 44 and 46, respectively. As a result, the WARN threshold can be set below the ALARM threshold by one of four predetermined values (e.g., 5° C., 10° C., 20° C., or 30° C.). By selecting different combinations of connections of the input 40 and the input 42 to the ground potential input 34 and the power supply input 32, the WARN threshold can be set to a different value.

Still referring to FIG. 2, the temperature display 20 includes a plurality of light-emitting diodes (LEDs) 48a–48f. The cathodes of the LEDs 48a–48f are tied to each other and preferably to ground potential, i.e., the ground potential input 34 of the temperature sensor integrated circuit 26, while the anodes of the LEDs 48a–48f are driven by outputs 50a–50f, respectively, of the temperature display driver circuit 18. As a result, when a current flows through one of the outputs 50a–50f, a corresponding one of the LEDs 48a–48f is illuminated. The LEDs 48a and 48b are adapted to be illuminated when the temperature of the memory circuits 14 are at or below the WARN threshold, indicating that the memory circuits 14 are operating within a normal temperature range. The LEDs 48c and 48d are adapted to be illuminated when the temperature exceeds the WARN threshold, indicating that some remedial action (e.g., operating a fan at low speed to cool the memory circuits 14) should be taken. The LEDs 48e and 48f are adapted to be illuminated when the temperature exceeds the ALARM threshold, indicating that immediate action (e.g., turning off an associated computer system or operating a fan at high speed) should be taken to prevent damage to the memory circuits 14. The LEDs 48a–48f can be color-coded (e.g., the LEDs 48a and 48b, the LEDs 48c and 48d, and the LEDs 48e and 48f can be in green, yellow, and red, respectively) to more readily indicate the foregoing temperature conditions of the memory module 10.

With regard to the temperature display driver circuit 18, the WARN output 28 and ALARM output 30 of the temperature sensor integrated circuit 26 are connected thereto to drive combinational logic inside the temperature display driver circuit 18. More particularly, the WARN output 28 is electrically connected to an input 52 of a NOR gate 54 (see FIG. 2) and an input 56 of a buffer 58 of the temperature display driver circuit 18. The ALARM output 30 is electrically connected to an input 60 of the NOR gate 54, a disable input 62 of the buffer 58, and to an input 64 of an exclusive-OR (XOR) gate 66.

Still referring to FIG. 2, an output 68 of the NOR gate 54 is electrically connected to an input of a resistor 70, an input of a resistor 96, and to a port 98 of the connector 22 (see FIGS. 1 and 2), while an output 74 of the buffer 58 is electrically connected to an input 76 of an XOR gate 78. An output 82 of the XOR gate 78 is electrically connected to an input of a resistor 84, an input of a resistor 100, and to a port 102 of the connector 22 (see FIGS. 1 and 2). Likewise, an output 90 of the XOR gate 66 is electrically connected to an input of a resistor 92, an input of a resistor 104, and to a port 106 of the connector 22.

The outputs of the resistors 70, 96, 84, 100, 92 and 104 are electrically connected to the LEDs 48a–48f, respectively, of the temperature display 20 to provide the current drive necessary to illuminate the LEDs 48a–48f, respectively, to a desired brightness.

With continued reference to FIG. 2, the temperature display driver circuit 18 also includes a NOR gate 108, a plurality of capacitors 110a–110c, and a plurality of resistors 112a–112f connected in series with each other. More particularly, an input of the resistor 112a is electrically connected to the power supply input 32 of the temperature sensor integrated circuit 26, while an output of the resistor 112f is electrically connected to an input 114 of the NOR gate 108 and to inputs of the capacitors 110a–110c. Outputs of the capacitors 110a–110c are tied to the ground potential input 34 of the temperature sensor integrated circuit 26. A second input 116 of the NOR gate 108 is tied to the ground potential input 34 of the temperature sensor integrate circuit 26, while an output 118 of the NOR gate 108 is tied to inputs 120 and 122 of the XOR gate 78 and the XOR gate 66, respectively.

The resistors 112a–112f, the capacitors 110a–110c, the NOR gate 108 and the XOR gates 78 and 66 cooperate to function as a display enable circuit that provides the temperature display driver circuit 18 and the temperature display 20 with a power-on test/verification capability. On power up, the input 114 of the NOR gate 108 is initially at 0 volts, which causes the output 118 of the NOR gate 108, and hence the inputs 120 and 122 of the XOR gate 78 and the XOR gate 66, respectively, to be in a logical high state. As a result, the outputs 82 and 90 of the XOR gates 78 and 66, respectively, are caused to be in a logic high state so as to cause the LEDs 48c–48f to be turned on. In addition, the WARN and ALARM outputs 28 and 30 of the temperature sensor integrated circuit 26, on power up, are in a logic low state and cause the output 68 of the NOR gate 54 to go into a logical high state, thereby driving the resistors 70 and 96 and hence illuminating the LEDs 48a and 48b to indicate that the sensed temperature is within a tolerable range. During power up, the capacitors 110a–110c begin to charge with a time constant that is the multiplication of the additive values of the resistors 112a–112f and the capacitors 110a–110c. During this time, even if the WARN and/or ALARM outputs 28, 30 are in a logic low state, the LEDs 48c–48f remain turned on so as to indicate to a user that the temperature display 20 is functioning properly.

When the voltage across the capacitors 110a–110c eventually exceeds the voltage threshold for a logical high state (typically in a few seconds), the output 118 of the NOR gate 108 becomes logical low until there is another power reset. The logical low state at the inputs 120 and 122 of the XOR gate 78 and the XOR gate 66, respectively, causes the outputs 82 and 90 of the XOR gates 78, 66, respectively, to track the output of the buffer 58 and the ALARM output 30, respectively. Thus, the LEDs 48c–48f, which are turned off after power up, can be illuminated depending on the state of the WARN and ALARM outputs 28, 30. Accordingly, if both of the WARN and ALARM outputs 28, 30 of the temperature sensor integrated circuit 26 are in a logic low state, then the output 68 of the NOR gate 54 is logical high, thereby driving resistors 70 and 96 and hence illuminating LEDs 48a and 48b. Since the inputs 76 and 120 of the XOR gate 78 are both logical low, its output 82 is logical low, thereby keeping the LEDs 48c and 48d turned off. Likewise, since the ALARM output 30 is logical low, the output 90 of the XOR gate 66 is in a logical low state, thereby keeping the LEDs 48e and 48f turned off.

When the temperature sensed by the temperature sensor integrate circuit 26 exceeds the WARN threshold (e.g., above 55° C.) but not the ALARM threshold, the WARN output 28 becomes logical high. As a result, the output 68 of the NOR gate 54 becomes logical low, thereby extinguishing the LEDs 48a and 48b. Since the buffer 58 is now enabled, the output 82 of the XOR gate 78 goes logical high, thereby causing the LEDs 48c and 48d to be illuminated so as to visually indicate to a user that the memory module 10 (i.e., the memory circuits 14) is reaching a relatively high operating temperature and that some remedial action (e.g., operating a fan at low speed to cool the memory circuits 14) should be taken. Since the ALARM output 30 is still logic low, the LEDs 48e and 48f remain tuned off.

When the temperature sensed by the temperature sensor circuit 26 exceeds the ALARM threshold (e.g., above 65° C.), the ALARM output 30 becomes logic high, while the WARN output 28 remains logic high. As a result, the output 68 of the NOR gate 54 remains logical low, thereby keeping the LEDs 48a and 48b turned off. Since the buffer 56 is disabled, the output 82 of the XOR gate 78 goes logical low, thereby extinguishing the LEDs 48c and 48d. The logic high state of the ALARM output 30 causes the input 64 of the XOR gate 66 to go logic high, thereby causing the LEDs 48e and 48f to be illuminated and so as to visually indicate to the user that the operating temperature of the memory module 10 (i.e., the memory circuits 14) is at a critical level, requiring immediate service or operating a fan at high speed.

Figure 5:
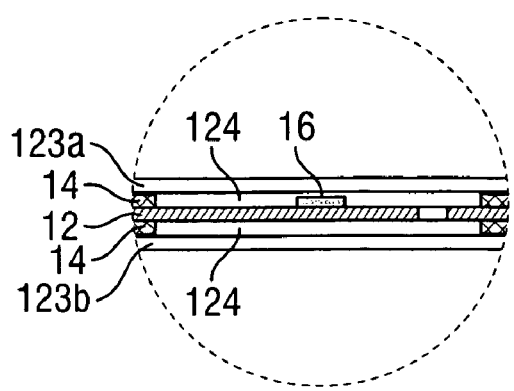
FIG. 5 is an enlarged view of a portion of the electronic module shown in FIG. 4.

FIGS. 3–5 illustrate structural details of the memory module 10 shown in FIGS. 1 and 2. The memory circuits 14 are mounted on opposing sides of the printed circuit board substrate 12. The memory module 10 is also provided with a pair of heat spreaders 123a and 123b, each of which is positioned on a corresponding side of the substrate 12 to dissipate and/or spread heat generated by the corresponding set of the memory circuits 14. More particularly, each of the heat spreaders 123a, 123b is attached to a corresponding set of the memory circuits 14 by a thermally conductive adhesive 124. In order to sense the temperature of the memory circuits 14, the temperature sensor 16 is positioned on the substrate 12 at a suitable location (e.g., located substantially at the center of the substrate 12 and covered by the heat spreader 123a). The thermally conductive adhesive 124 can also be used to thermally connect the temperature sensor 16 to the heat spreader 123a such that the temperature of the memory circuits 14 can be more accurately sensed by the temperature sensor 16. The LEDs 48a–48f are also mounted directly on the substrate 12, thereby forming an integrated part of the substrate 12 and hence the memory module 10. The LEDs 48a–48f are positioned on the substrate 12 such that they can be viewed readily by a user. As is conventional, the memory module 10 is provided with a pin connector 125 for connecting the memory module 10 to an interface slot of an associated electronic device (e.g., a personal computer).

It should be noted that the memory module 10 of the present invention provides numerous advantages over the prior art discussed above. For instance, the temperature sensing/displaying system (i.e., the temperature sensor 16, the temperature display driver circuit 18, and the temperature display 20) is provided directly on (i.e., integrated with) the substrate 12, thereby forming a single, self-contained module with the memory circuits 14. In other words, the memory module 10 is self-contained and/or integrated with a temperature display to indicate its operating temperature without the use of additional software and/or external hardware. In such circumstances, users (e.g., "power users" and "game enthusiasts") can take appropriate action based upon the temperature condition indicated by the temperature display 20 of the memory module 10. For instance, when the LEDs 48a and 48b are illuminated, the user can continue with the normal use of an associated electronic device (e.g., a personal computer). If the LEDs 48c and 48d become illuminated, they indicate to the user that the memory module 10 is reaching a relatively high operating temperature and that some remedial action (e.g., operating a fan at low speed to cool the memory circuits 14) should be taken. Similarly, when the LEDs 48e and 48f become illuminated, the temperature display 16 indicates to the user that the operating temperature of the memory module 10 is at a critical level and that immediate service (e.g., turning off the computer or operating a fan at high speed) is required. As noted above, the LEDs 48a–48f can be coded with predetermined colors (e.g., the LEDs 48a and 48b, the LEDs 48c and 48d, and the LEDs 48e and 48f, can be in green, yellow, and red, respectively) such that the user can readily recognize the temperature condition of the memory module 10.

Because only one set of the LEDs 48a–48f is selectively illuminated at any one time, the temperature condition of the memory module 10 is clearly indicated by the temperature display 20 without creating confusion which would result from having multiple sets of the LEDs 48a–48f being illuminated. By way of example, when the LEDs 48e and 48f are illuminated, the LEDs 48a and 48b and the LEDs 48c and 48d are turned off, thereby clearly indicating to the user that the memory module 10 has reached a critical temperature condition.

It should be noted that the memory module 10 can have numerous variations and modifications. For instance, the memory module 10 can be provided with a different number of resistors/LEDs for each threshold level. For instance, only one LED (i.e., the LED 48a or the LED 48b) or more than two LEDs can be provided to indicate normal temperature condition. Generally, the number of LEDs per logic output is dependent on the fan-out capability of the NOR gate 54, and/or the XOR gates 66 and 78, respectively. It would be clear to one skilled in the art to add additional high current buffers to the outputs of the NOR gate 54, and/or the XOR gates 66 and 78 to increase the number of LEDs that can be driven by these outputs.

Another variation of the memory module 10 would involve eliminating a power-on start-up circuit such as the resistors 112a–112f, the capacitors 110a–110c, the NOR gate 108, and/or the XOR gates 66 and 78. Still another variation would involve reducing or increasing the number of the resistors 112a–112f and the capacitors 110a–110c. The number of resistors and capacitors is chosen to achieve a desired time constant and is thereby dependent on practical considerations.

The memory module 10 can also be provided with a heat sink instead of the printed circuit board substrate 12 such that the temperature sensor 16, the temperature display driver 18, the temperature display 20, and/or the connector 22 can be mounted directly on the heat sink so as to monitor its temperature. In this manner, when the heat sink is attached to an electronic device, such as a microprocessor, the temperature sensor 16 can indirectly monitor the temperature condition of the associated electronic device without altering the circuit board on which the electronic device is placed.

As noted above, the present invention can also be used in conjunction with other types of electronic or electrical devices. For instance, the temperature sensor 16, the temperature display driver 18, the temperature display 20, and the connector 22 can be included in a graphics card adapted to be plugged into a connector of a motherboard of a personal computer. The temperature sensor 16 can be thermally coupled to a particular electronic component of the graphics card or to the entire graphics card to monitor the temperature condition of the graphics card. Additional electronic/electrical devices suitable for use in connection with the present invention include, without limitation, modems, Ethernet cards, universal serial bus cards, and the like. The memory module 10 can also be modified to include a static random-access memory, a flash memory, an EEPROM memory, a ROM memory, etc.

Figure 6:
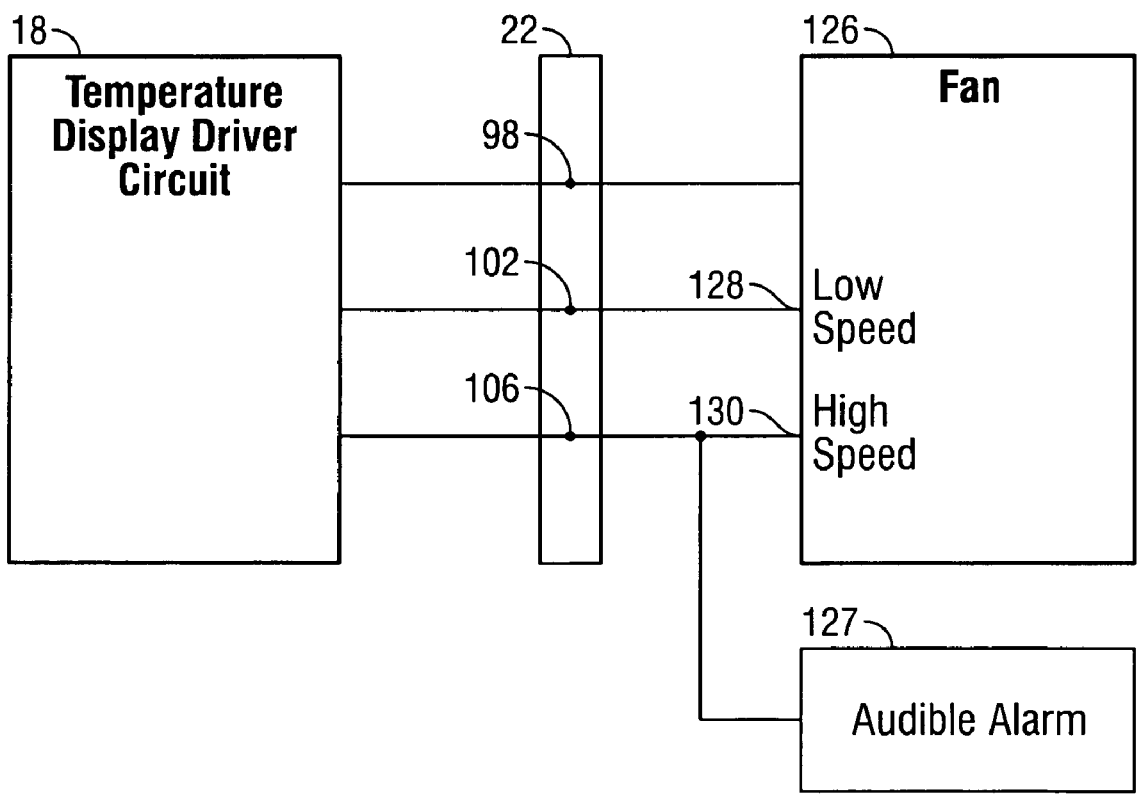
FIG. 6 is a block diagram illustrating how the electronic module shown in FIG. 1 can be used to operate an external fan and audible alarm.

With reference to FIG. 6, the memory module 10 can be configured to operate an external fan 126 and/or an external audible alarm 127. More particularly, the ports 102, 106 of the connector 22 of the memory module 10 (see FIGS. 1 and 2) can be connected to inputs 128 and 130, respectively, of the external fan 126 via a cable. The port 106 can also be connected to the audible alarm 127 via the same cable or a different cable. The input 128 is adapted to operate the external fan 126 at low speed when the port 102 is at a high logical level (i.e., when the temperature sensed by the temperature sensor 16 is above the WARN threshold), while the input 130 is adapted to operate the external fan 126 at high speed and to activate the audible alarm 127 when the port 106 is at a high logic level (i.e., when the temperature sensed by the temperature sensor 16 is above the ALARM threshold). Alternatively, the temperature display driver circuit 18 can also be designed to drive an external temperature display (not shown) via the connector 22.

Now referring to FIG. 7–12, there is shown a memory module 1010 constructed in accordance with a second embodiment of the present invention. Elements illustrated in FIGS. 7–12, which correspond, either identically or substantially, to the elements described above with respect to the embodiment of FIGS. 1–6, have been designated by corresponding reference numerals increased by one thousand. Unless otherwise stated, the embodiment of FIGS. 7–12 is constructed and operates in the same basic manner as the embodiment of FIGS. 1–6.

Figure 7:
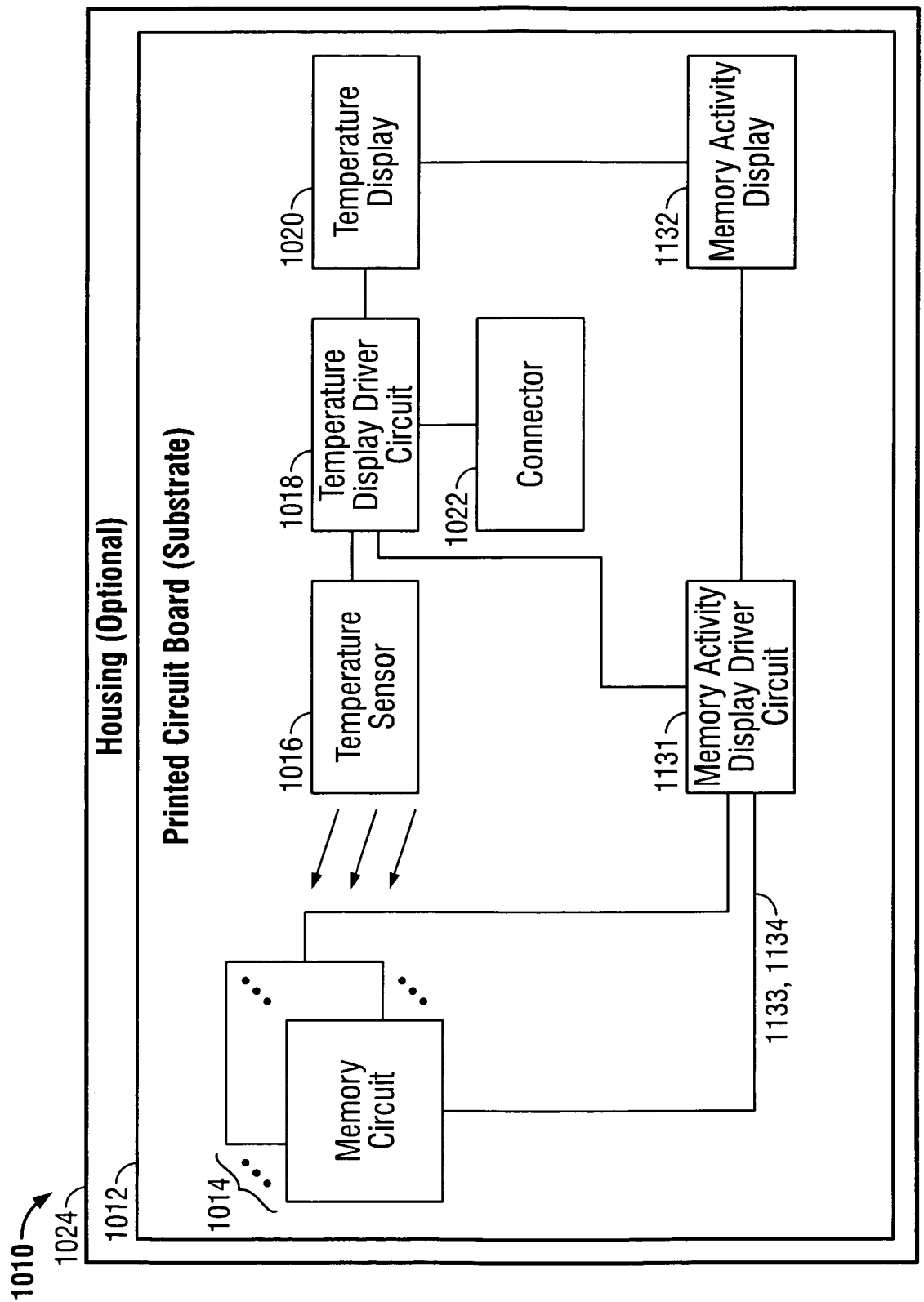
FIG. 7 is a block diagram of an electronic module constructed in accordance with a second embodiment of the present invention.

With reference to FIG. 7, the memory module 1010 includes a substrate 1012 (e.g., a printed circuit board substrate). On the substrate 1012 are mounted electronic/electrical components, including memory circuits 1014, a temperature sensor 1016, a temperature display driver circuit 1018, a temperature display 1020 and a connector 1022 which are constructed and operate in the same basic manner as the corresponding components included in the embodiment of FIGS. 1–6. The memory module 1010 also includes a memory activity display driver circuit 1131 and a memory activity display 1132. Optionally, a housing 1024 can be provided for housing or encasing the printed circuit board substrate 1012, as well as the electronic/electrical components mounted thereon. Chip select leads 1133, 1134 from the memory circuits 1014 are electrically connected to the memory activity display driver circuit 1131 for sending an electrical signal corresponding to the amount of memory activity (i.e., a count of memory read/write accesses in a given time period) of the memory circuits 1014. The memory activity display 1132 is adapted to receive an electrical signal(s) processed by the memory activity display driver circuit 1131 and displaying the amount of memory activity of the memory module 1010 in substantially real time.

Figure 8A:
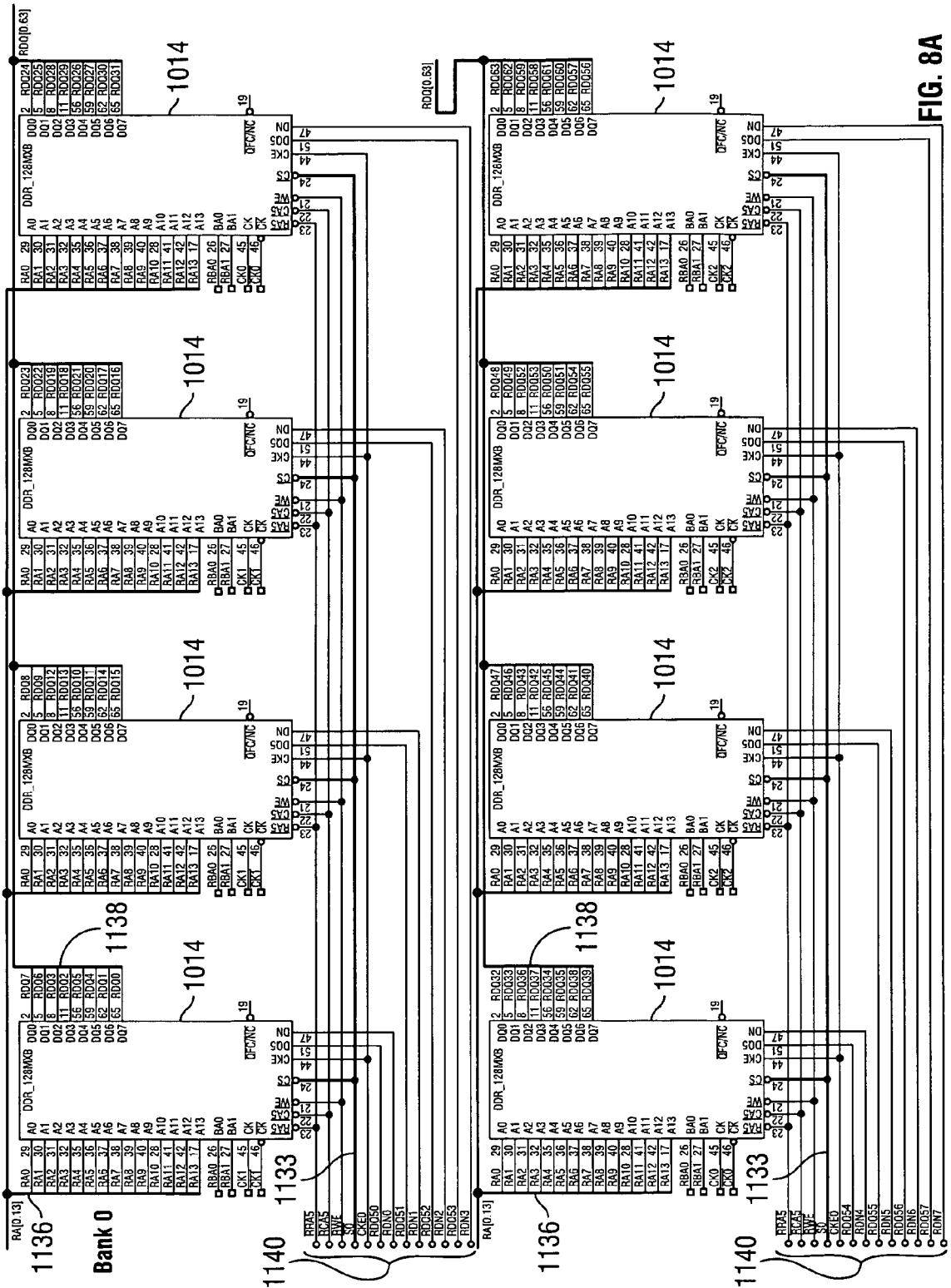
FIG. 8A is an electronic schematic diagram of a first bank of a memory circuit utilized in the electronic module shown in FIG. 7.
Figure 8B:
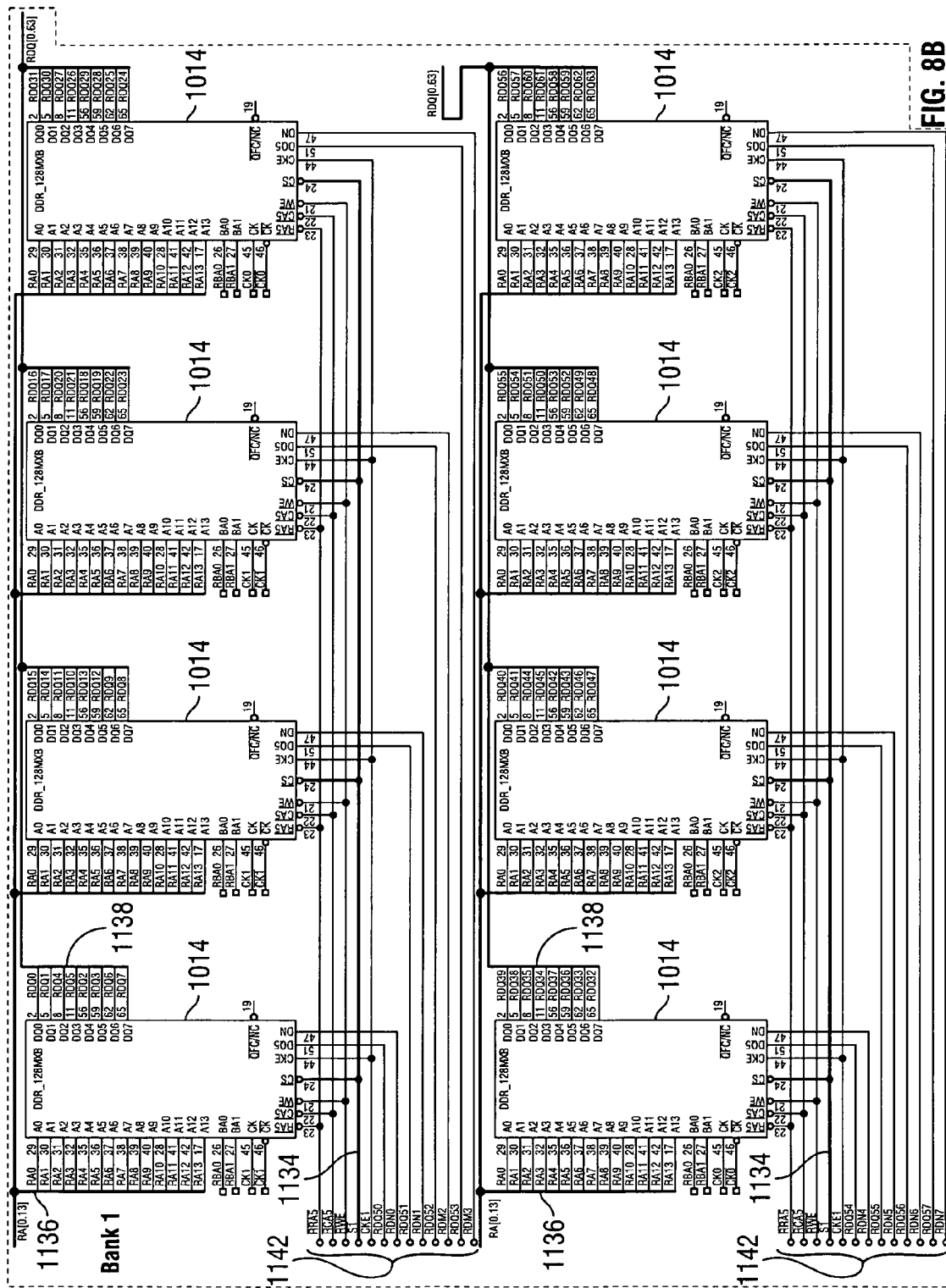
FIG. 8B is an electronic schematic diagram of a second bank of a memory circuit utilized in the electronic module shown in FIG. 7.

Now referring to FIGS. 8A and 8B, the memory circuits 1014 are interconnected to one another in a conventional manner. The memory circuits 1014 can be divided into a plurality of banks (e.g., Bank 0 and Bank 1), with common address bus 1136 and common data bus 1138, interconnected as shown in FIGS. 8A and 8B. What distinguishes between the banks are the interconnections for the control buses 1140 and 1142 corresponding to the memory Bank 0 and memory Bank 1, respectively. More particularly, the control buses 1140 and 1142 have separate chip select leads, 1133 and 1134, respectively, which are labeled in FIG. 8A as "S0" for Bank 0 and in FIG. 8B as "S1" for Bank 1, respectively. When the memory circuits 1014 of Bank 0 are to be selected for addressing, reading, and/or writing, S0 is enabled. Likewise, when the memory circuits 1014 of Bank 1 are to be selected for addressing, reading, and/or writing, S1 is enabled. The number of times S0 and S1 are enabled is the indication of memory activity that is sensed by the memory activity display driver circuit 1131.

Figure 9A:
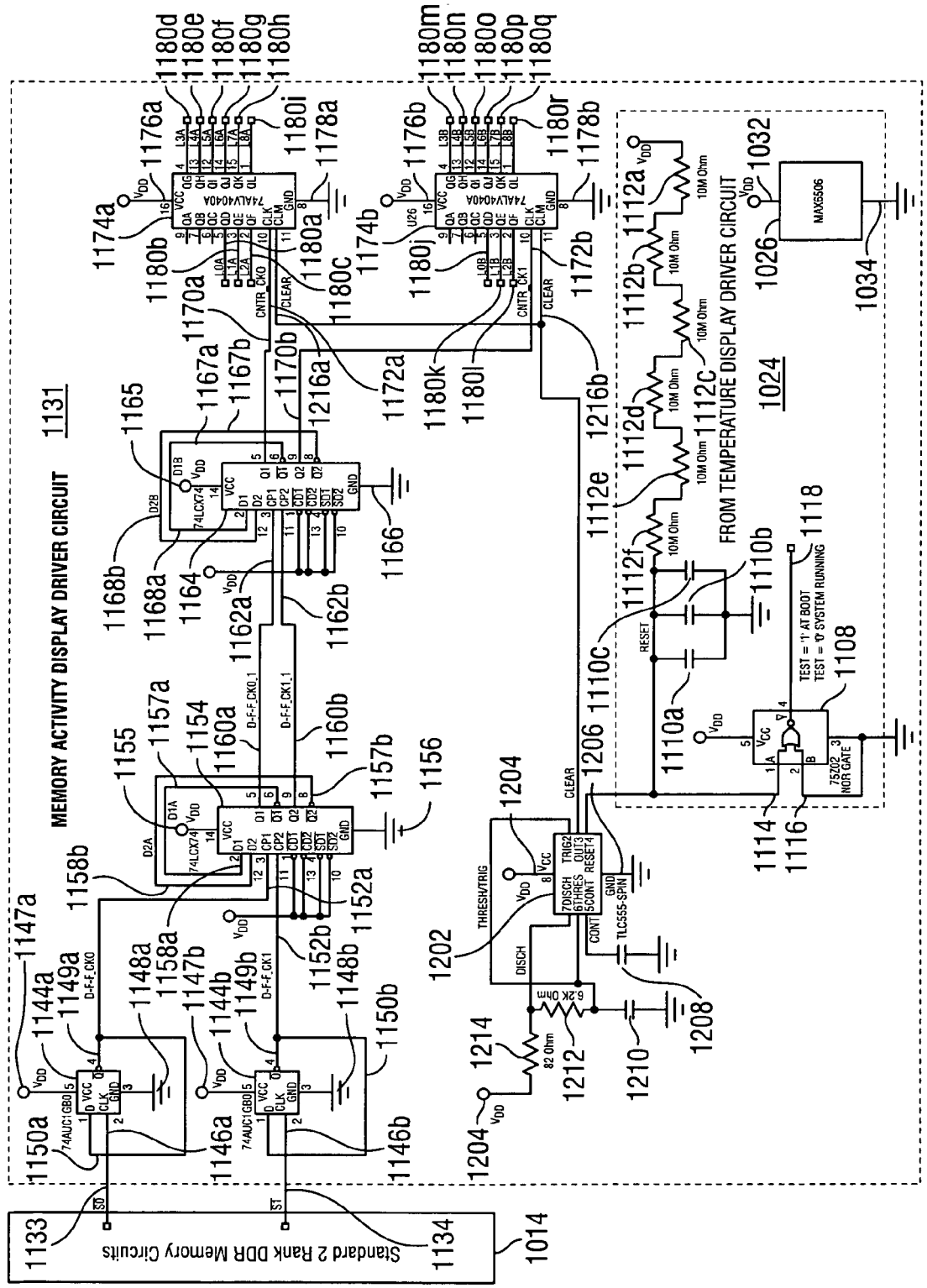
FIGS. 9A and 9B are electronic schematic diagrams of a memory activity display driver circuit and a memory display circuit utilized in the electronic module of FIG. 7.
Figure 9B:
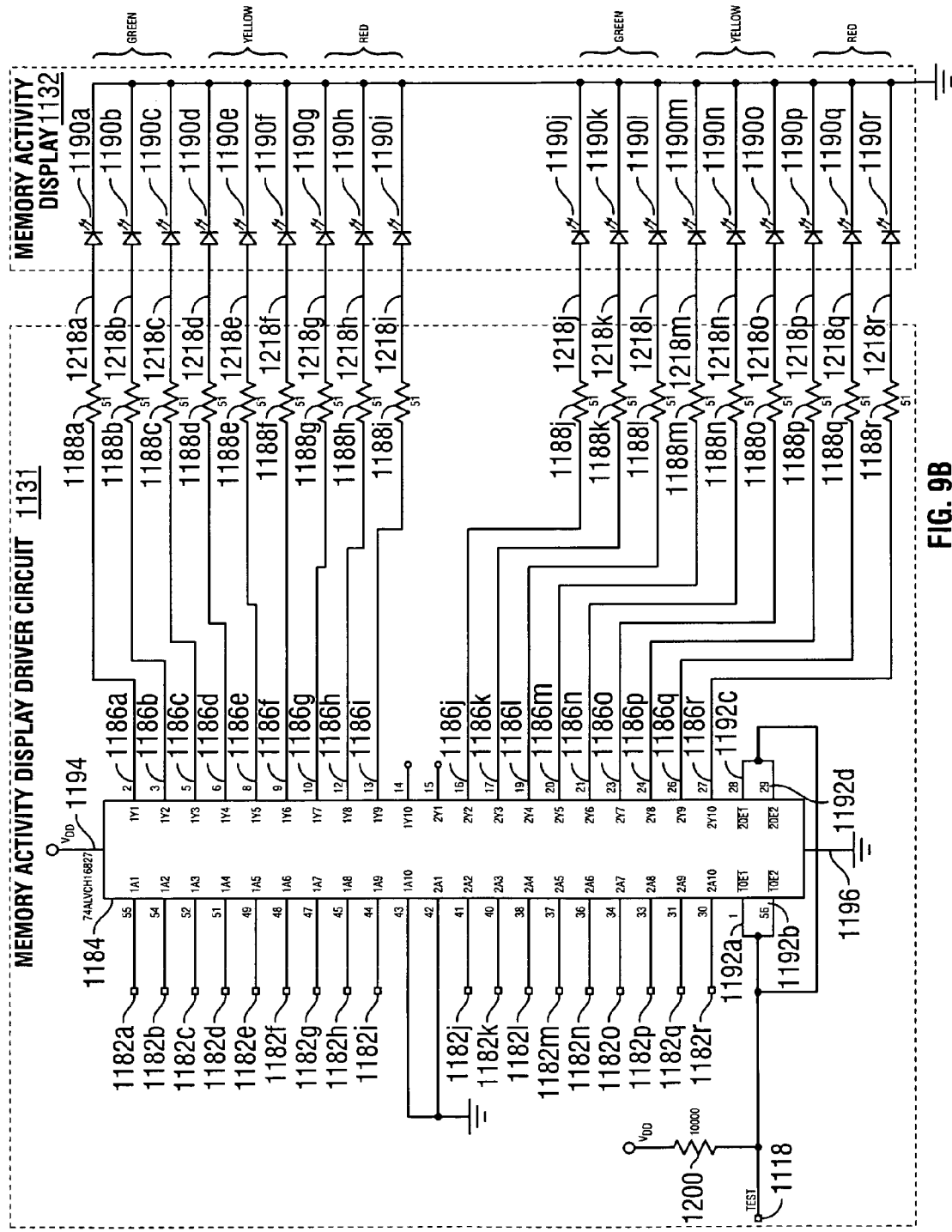

FIGS. 9A and 9B schematically illustrate electronic elements of the memory activity display driver circuit 1131 and the memory activity display 1132. More particularly, the memory activity display driver circuit 1131 includes a pair of D-flip-flops 1144*a*, 1144*b*, whose inputs 1146*a*, 1146*b*, labeled "CLK" (Clock) in FIG. 9A, are electrically connected to the chip select leads 1133, 1134, respectively, of the memory circuits 1014. The power supply inputs 1147*a*, 1147*b* of the D-flip-flops 1144*a*, 1144*b*, respectively, are electrically connected to a power supply input 1032 of the temperature sensor integrated circuit 1026 of the temperature display driver circuit 1018. Similarly, ground potential inputs 1148*a*, 1148*b* of the D-flip-flops 1144*a*, 1144*b*, respectively, are electrically connected to the ground potential input 1034 of the temperature sensor integrated circuit 1026. Inverting outputs 1149*a*, 1149*b* of the D-flip-flops 1144*a*, 1144*b*, respectively, are electrically connected to their respective inputs 1150*a*, 1150*b*, respectively, labeled "D" in FIG. 9A. The outputs 1149*a*, 1149*b* of the D-flip-flops 1144*a*, 1144*b*, respectively, are electrically connected to inputs 1152*a*, 1152*b*, respectively, of a next stage dual D-flip-flop 1154 which are labeled "CP1" and "CP2", respectively, in FIG. 9A. The power supply input 1155 of the dual D-flip-flop 1154 is electrically connected to a power supply input 1032 of the temperature sensor integrated circuit 1026 of the temperature display driver circuit 1018. Similarly, ground potential input 1156 of the dual D-flip-flop 1154 is electrically connected to the ground potential input 1034 of the temperature sensor integrated circuit 1026. Inverting outputs 1157*a*, 1157*b* of the dual D-flip-flop 1154 are electrically connected to D inputs 1158*a*, 1158*b*, respectively, of the dual D-flip-flop 1154, while non-inverting output 1160*a*, 1160*b* of the dual D-flip-flop 1154 are electrically connected to inputs 1162*a*, 1162*b* of a dual D-flip-flop 1164, labeled "CP1" and "CP2", respectively. The power supply input 1165 of the dual D-flip-flop 1164 is electrically connected to a power supply input 1032 of the temperature sensor integrated circuit 1026 of the temperature display driver circuit 1018. Similarly, ground potential input 1166 of the dual D-flip-flop 1164 is electrically connected to the ground potential input 1034 of the temperature sensor integrated circuit 1026. Inverting outputs 1167*a*, 1167*b* of the dual D-flip-flop 1164 are electrically connected to D inputs 1168*a*, 1168*b*, respectively, of the dual D-flip-flop 1164, while non-inverting outputs 1170*a*, 1170*b* of the dual D-flip-flop 1164 are fed to inputs 1172*a*, 1172*b*, respectively, labeled "CLK" in FIG. 9A, of up-counters 1174*a*, 1174*b*, respectively. The logic levels of the non-inverting outputs 1170*a*, 1170*b* of the dual D-flip-flop 1164 represent the number of times the chip select leads 1133, 1134 (i.e., Bank 0 and Bank 1), respectively, of the memory circuits 1014 have been accessed divided by 8.

Still referring to FIG. 9A, the power supply inputs 1176*a*, 1176*b* of the up-counters 1174*a*, 1174*b*, respectively, are electrically connected to a power supply input 1032 of a temperature sensor integrated circuit 1026 of the temperature display driver circuit 1018. Similarly, ground potential inputs 1178*a*, 1178*b* of the up-counters 1174*a*, 1174*b*, respectively, are electrically connected to a ground potential input 1034 of the temperature sensor integrated circuit 1026. Outputs 1180*a*–1180*i* of the up-counter 1174*a* are electrically connected to inputs 1182*a*–1182*i* (see FIG. 9B), respectively, of a multi-buffer circuit 1184, while outputs 1180*j*–1180*r* of the up-counter 1174*b* are electrically connected to inputs 1182*j*–1182*r* (see FIG. 9B), respectively, of the multi-buffer circuit 1184. Outputs 1186*a*–1186*r* of the multi-buffer circuit 1184 are in turn electrically connected to inputs of resistors 1188*a*–1188*r*, respectively. Outputs of the resistors 1188*a*–1188*r* are in turn connected to cathodes of LEDs 1190*a*–1190*r*, respectively, of the memory activity display 1132.

Inputs 1192*a*–1192*d* are all connected to each other (see FIG. 9B). More particularly, input 1192*a* controls the enabling and disabling of the inputs 1182*a*–1182*i* of the multi-buffer circuit 1184; the input 1192*b* controls the enabling and disabling of the inputs 1182*j*–1182*r* of the multi-buffer circuit 1184; the input 1192*c* controls the enabling and disabling of the outputs 1186*a*–1186*i* of the multi-buffer circuit 1184; and the input 1192*d* controls the enabling and disabling of the outputs 1186*j*–1186*r* of the multi-buffer circuit 1184.

With continued reference to FIG. 9B, a power supply input 1194 of the multi-buffer circuit 1184 is electrically connected to the power supply input 1032 of the temperature sensor integrated circuit 1026, while a ground potential input 1196 of the multi-buffer circuit 1184 is electrically connected to the ground potential input 1034 of the temperature sensor integrated circuit 1026. The input 1196 of the multi-buffer circuit 1184 is also electrically connected to an input of a resistor 1200 and to an output 1118 of the NOR gate 1108 of the temperature display driver circuit 1018. The resistor 1200 has an output which is electrically connected to the power supply input 1194 of multi-buffer circuit 1184.

Referring back to FIG. 9A, the memory activity display driver circuit 1131 also includes a timer integrated circuit unit 1202. While the timer integrated circuit unit 1202 can be any type of conventional timer circuit, a timer integrated circuit unit of the type 555 known in the art is suitable for use in conjunction with the present invention. In such circumstances, the timer unit 1202 will be discussed hereinafter in conjunction with the integrated circuit type 555 timer with the understanding that other types of timer circuits can be utilized.

An input labeled "RESET" of the timer unit 1202 is electrically connected to an input 1114 of a NOR gate 1108 of the temperature display driver circuit 1024. A power supply input 1204 of the timer unit 1202 is electrically connected to the power supply input 1032 of the temperature sensor integrated circuit 1026, while a ground potential input 1206 of the timer unit 1202 is electrically connected to the ground potential input 1034 of the temperature sensor integrated circuit 1026. A capacitor 1208 is also provided, having an input, which is electrically connected to the ground potential input 1206 of the timer unit 1202, and an output, which is electrically connected to an input of the timer unit 1202 labeled "CONT". Similarly, a capacitor 1210 has an input, which is electrically connected to the ground potential input 1206 of the timer unit 1202, and an output, which is electrically connected to inputs of the timer unit 1202 labeled "THRES" and "TRIG". A resistor 1212 is also provided in the memory activity display driver circuit 1131, and has an output, which is electrically connected to the inputs of the timer unit 1202 labeled "THRES" and "TRIG", as well as an output electrically connected to an input of the timer unit 1202 labeled "DISCH". In addition, an output of a resistor 1214 is electrically connected to an input of the timer unit 1202 labeled "DISCH", while an input of the resistor 1214 is electrically connected to the power supply input 1204 of the timer unit 1202. The timer unit 1202 has an output labeled "OUT" electrically connected to inputs 1216a, 1216b labeled "CLR" (CLEAR) of the up-counters 1174a, 1174b, respectively.

Now referring back to FIG. 9B, the cathodes of the LEDs 1190a–1190r of the memory activity display 1132 are tied to each other and preferably to ground potential, i.e. the ground potential input 1034 of the temperature sensor integrated circuit 1026, while the anodes of the LEDs 1190a–1190r are driven by outputs 1218a–1218r, respectively, of the memory activity display driver circuit 1131. When a current flows through one of the resistors 1188a–1188r, a corresponding one of the LEDs 1190a–1190r is illuminated. The LEDs 1190a–1190c, 1190j–1190l, which have a predetermined color (e.g., green), are adapted to be illuminated when the memory activity of the memory circuits 1014 is at a "low" level of activity. The LEDs 1190d–1190f, 1190m–1190o, which have a predetermined color (e.g., yellow), are adapted to be illuminated when the memory activity of the memory circuits 1014 is at a "medium" level of activity. The LEDs 1190g–1190i, 1190p–1190r, which have a predetermined color (e.g., red), are adapted to be illuminated when the memory activity of the memory circuits 1014 is at a "high" level of activity. The "medium" and "low" orders LEDs 1190a–1190f and 1190j–1190o will be illuminated when the "high" order LEDs 1190g–1190i and 1190p–1190r, respectively, are illuminated. Likewise, the "low" orders LEDs 1190a–1190c and 1190j–1190l will be illuminated when the "medium" order LEDs 1190d–1190f and 1190m–1190o, respectively, are illuminated.

In operation, the time period or "window" during which the output labeled "OUT" of the timer unit 1202 is in a logical low state is set by the numerical values of the resistors 1212, 1214 and the capacitor 1210 (see FIG. 9A). At the end of this "window" period, the output labeled "OUT" of the timer unit 1202 goes momentarily into a logical high state, thereby "resetting" the count of the up-counters 1174a and 1174b to zero. During the time period when the output labeled "OUT" of the timer unit 1202 is in a logical low state, the chip select leads 1133 and 1134 of the memory circuits 1014 alternate between low and high logical states, indicating memory activity. The chip select leads clock the inputs 1146a, 1146b of the D-flip-flops 1144a, 1144b, respectively. The outputs 1149a, 1149b of the D-flip-flops 1144a, 1144b, respectively, in turn clock the inputs 1152a, 1152b, respectively, of the dual D-flip-flop 1154. In response, the outputs 1160a, 1160b of the dual D-flip-flop 1154 clock the inputs 1162a, 1162b, respectively, of the dual D-flip-flop 1164. The outputs 1170a, 1170b of the dual D-flip-flop 1164 then clock the inputs 1172a, 1172b, respectively, of the up-counters 1174a, 1174b, respectively. As a result, the up-counters 1174a, 1174b will count upwards from zero until reset when the output labeled "OUT" of the timer unit 1202 goes momentarily to a high logical state, hence beginning the counting process from zero all over again.

The outputs 1180a–1180i of the up-counter 1174a and the outputs 1180j–1180r of the up-counter 1174b "count" or go to a logical high state in successive powers of 2 beginning with the lowest order bits represented by the outputs 1180a, 1180j, respectively. Since the lowest three output "bits" 1180a–1180c of the up-counters 1174a, 1174b are not used, the outputs 1180a, 1180j begin with a count that is $2^3$ greater than that of the outputs 1170a, 1170b of the dual D-flip-flop 1164.

When the outputs 1180a–1180c and 1180l–1180l representing the lowest three powers of 2 of the up-counters 1174a, 1174b go to a logical high state during the counting time period, the outputs 1186a–1186c and 1186l–1186j of the multi-buffer circuit 1184 go into a logical high state so as to drive the resistors 1188a–1188c and 1188j–1188l, respectively. The outputs of the resistors 1188a–1188c and 1188j–1188l drive and thus illuminate the LEDs 1190a–1190c and 1190l–1190j, respectively.

Similarly, when the outputs 1180d–1180f and 1180m–1180o representing the middle three powers of 2 of the up-counters 1174a, 1174b go to a logical high state during the counting time period, the outputs 1186d–1186f and 1186m–1186o of the multi-buffer circuit 1184 will go to a logical high state so as to drive the resistors 1188d–1188f and 1188m–1188o, respectively. The outputs of the resistors 1188d–1188f and 1188m–1188o drive and thus illuminate the LEDs 1190d–1190f and 1190m–1190o, respectively.

Likewise, when the outputs 1180g–1180l and 1180p–1180r represented by the upper three powers of 2 of the up-counters 1174a, 1174b go to a logical high state during the counting time period, the outputs 1186g–1186l and 1186p–1186r of the multi-buffer circuit 1184 go to a logical high state so as to drive the resistors 1188g–1188l and 1188p–1188r, respectively. The outputs of the resistors 1188g–1188l and 1188p–1188r drive and thus illuminate the LEDs 1190g–1190l and 1190p–1190r, respectively.

The memory module 1010 of the present invention is adapted to temporarily suspend the illumination of the LEDs 1190a–1190r during power-up. Without providing such a function, power-up will cause the LEDs 1190a–1190r to illuminate randomly for a period of time until all circuitry settles to a steady state. To keep the LEDs 1190a–1190r turned off until steady state has been reached, the multi-buffer circuit 1184 is disabled. Initially, the voltage across the capacitors 1110a–1110c will be zero, rising exponentially in a few second to a final value. During the charging time, the input labeled "RESET" of the timer unit 1202 is in a logical low state so that the output labeled "CLEAR" of the timer unit 1202 is in a logical high state, thereby initially setting the count of the up-counters 1174a, 1174b at 0. During this same charging time, the output 1118 of the NOR gate 1108 of the temperature display driver circuit 1018 will be in a logical high state, thereby disabling (setting to a logical low state) the inputs 1182a–1182r and the outputs 1186a–1186r of the multi-buffer circuit 1184. Thus, the LEDs 1190a–1190r stay turned off until the voltage on the capacitors 1110a–1110c reaches a value that causes the output 1118 of the NOR gate 1108 to go to a logical low state, enabling counting and thus the possible illumination of the LEDs 1190a–1190r.

Figure 10:
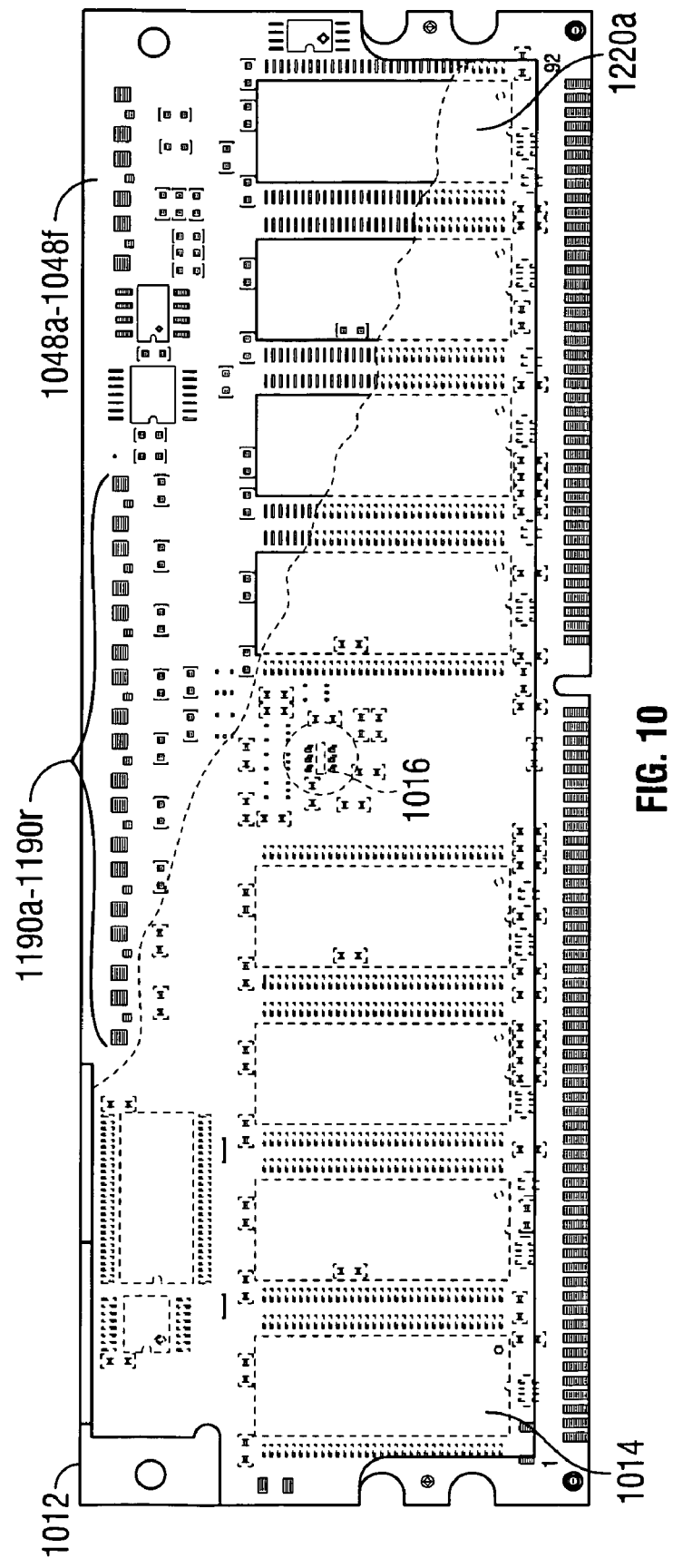
FIG. 10 is a top plan view of the electronic module shown in FIG. 7.

FIG. 10 illustrates the structural details of the memory module 1010 shown in FIG. 7. The structural details of the memory module 1010 of FIG. 10 are identical to the embodiment illustrated in FIG. 3, except for the addition of the LEDs 1190a–1190r of the memory activity display 1132, which are mounted directly on the substrate 1012, which thereby form an integrated part of the substrate 1012 and hence the memory module 1010. The LEDs 1190a–1190r are positioned on the substrate 1012 near the top center of the substrate 1012 such that they can be viewed readily by a user so as to indicate the extent to which the memory circuits 1014 are being used.

It should be noted that the memory module 1010 can have numerous variations and modifications. For instance, the memory module 1010 can have one, two, or more memory banks, and the number of memory circuits per bank can be varied. It would be apparent to one skilled in the art that the memory module 1010 of the present invention can have as little as one memory circuit and one memory bank. To monitor memory activity, the memory module 1010 can be provided with one memory circuit, one up-counter, one buffer, one resistor, and one LED for indicating a "high" level of memory activity when the LED is illuminated. It would be apparent to one skilled in the art that an appropriate number of D-flip-flops, up-counters, buffers, resistors, and LEDs can be added when it is desirable for the memory module 1010 to contain more than two memory banks.

In accordance with another variation of the module 1010, the number of D-flip-flops cascaded in a row can be varied. The cascaded D-flip-flops 1144a, 1144b, 1154, and 1164 constitute the logical construction of two divide-by-N counters when N is 8. In the memory module 1010, the preferred value of N is 8, but the choice of N can be selected to bring the number of accesses to the memory circuits 1014 down to an arbitrary count that would result in displaying a varying range of memory activity over the number of the LEDs 1190a–1190r. Thus N, D-flip-flops can be cascaded where N is greater than or equal to zero.

Figure 11:
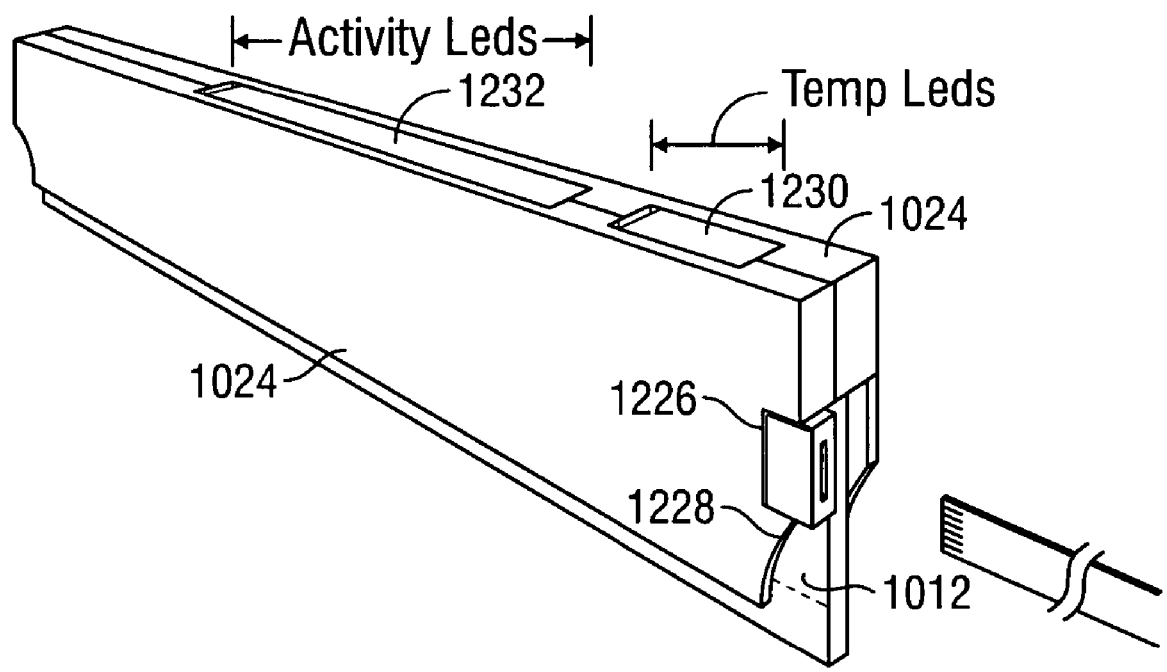
FIG. 11 is a perspective view of a modified version of the electronic module shown in FIG. 7, the electronic module being equipped with an optional housing.

With reference to FIG. 11, the memory module 1010 can be provided with an external optional casing 1024. The optional casing 1024 is generally of rectangular shape and has a rectangular opening 1226 for receiving the connector 1022 which is mounted on the printed circuit board substrate 1012. The optional casing 1024 encases substantially the entire printed circuit board 1012 except at its bottom end where a pin-type connector is located for coupling the memory module 1010 to an associated electronic device (e.g., a personal computer). The optional casing 1024 is provided with two rectangular openings 1230 and 1232 at an upper end thereof. The opening 1232 is aligned with the LEDs 1190a–1190r such that the LEDs 1190a–1190r can be viewed by the user. Similarly, the opening 1230 is aligned with LEDs 1048a–1048f (see FIG. 10) adapted to indicate the temperature condition of the memory module 1010 so that the LEDs 1048a–1048f can be viewed by the user.

Figure 12:
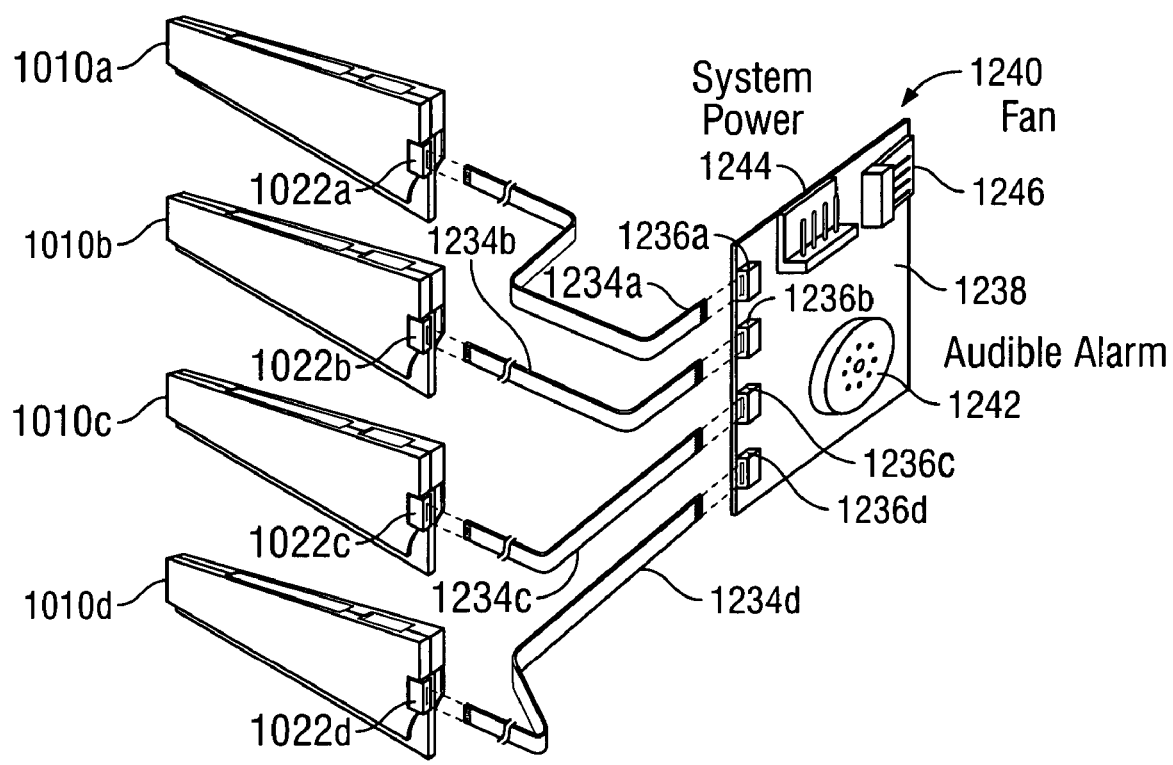
FIG. 12 is a perspective view of an array of electronic modules adapted to operate a remote alarm/fan adapter.

With reference to FIG. 12, multiple memory modules 1010a–1010d, of the same type as the memory module 1010, are mated with ribbon cables 1234a–1234d, respectively, via external fan/audible alarm connectors 1022a–1022d of each module 1010a–1010d. Opposite ends of the ribbon cables 1234a–1234d are mated to connectors 1236a–1236d on a printed circuit board 1238. The printed circuit board 1238 also contains an audible alarm 1242, a connector 1244 for connecting power to the printed circuit board 1238, and a connector 1246 for connecting an external fan (not shown) to the printed circuit board 1238. Signals carried by the ribbon cables 1234a–1234d are logically OR-ed to the inputs of the audible alarm 1242 and the fan (not shown) via circuitry (not shown). In this way, any one of the WARN outputs of the temperature sensor integrated circuits of each of the modules 1010a–1010d can operate the fan at low speed, and any one of the ALARM outputs of the temperature sensor integrated circuits of the modules 1010a–1010d can operate the fan at high speed and operate the audible alarm 1242.

It will be understood that the embodiments described herein are merely exemplary and that a person skilled in the art may make many variations and modifications without departing from the spirit and scope of the invention. All such variations and modifications are intended to be included within the scope of the invention as defined in the appended claims.

What is claimed is:

1. An electronic device comprising at least one solid state memory circuit; a temperature sensor located adjacent said at least one solid state memory circuit for sensing a temperature condition of said at least one solid state memory circuit; display for electronically displaying the temperature condition sensed by said sensors; and a printed circuit board, said at least one solid state memory circuit, said sensor and said display being integrated with one another on said printed circuit board as a single, self-contained module.

2. The device of claim 1, further comprising a driver circuit for receiving and processing an electrical signal transmitted from said sensor so as to operate said display, said driver circuit being integrated with said at least one solid state memory circuit, said sensor, said printed circuit board, and said display so as to form said module.

3. The device of claim 2, wherein said at least one solid state memory circuit includes at least one dynamic random-access memory.

4. The device of claim 2, wherein said display is operative to display a first temperature condition of said at least one solid state memory circuit when the temperature sensed by said sensor is below a first temperature threshold and to display a second temperature condition of said at least one solid state memory circuit when the temperature sensed by said sensor is above said first temperature threshold.

5. The device of claim 1, further comprising monitoring means for monitoring the extent to which said at least one solid state memory circuit is accessed and displaying means for displaying the extent monitored by said monitoring means.

6. The device of claim 2, further comprising connecting means for connecting said driver circuit to at least one of an audible signal device and a cooling device such that said at least one of said audible signal device and said cooling device can be activated when the temperature sensed by said sensor is at or above a predetermined threshold.

7. An electronic device comprising at least one electronic component including at least one memory circuit for storing data therein; a temperature sensor located adjacent said at least one electronic component for sensing a temperature condition of said at least one electronic component, including said at least one memory circuit; a display for electronically displaying the temperature condition sensed by said sensor, said display being operative to display a first temperature condition of said at least one electronic component when the temperature sensed by said sensor is below a first temperature threshold and to display a second temperature condition of said at least one electronic component when the temperature sensed by said sensor is above said first temperature threshold, said display including a first displaying means for displaying said first temperature condition and second displaying means for displaying said second temperature condition; and a driver circuit for receiving and processing an electrical signal transmitted from said sensor so as to operate said display, said at least one memory circuit, said sensor, said display, and said driver circuit being integrated with one another as a single, self-contained module.

8. The device of claim 7, wherein each of said first and second displaying means includes at least one light emitting diode operated by said driver circuit.

9. The device of claim 8, wherein said display is operative to display a third temperature condition of said at least one electronic component when the temperature sensed by said sensor is above a second temperature threshold, which is greater than said first temperature threshold.

10. The device of claim 9, wherein said display includes third displaying means for displaying said third temperature condition, said third displaying means including at least one light emitting diode operated by said driver circuit.

11. The device of claim 7, wherein said display includes third displaying means for displaying a third temperature condition of said at least one electronic component when the temperature sensed by said sensor is above a second threshold, which is greater than said first threshold.

12. The device of claim 11, wherein said driver circuit includes first activating means for activating said first displaying means when the temperature sensed by said sensor is below said first threshold, second activating means for activating said second displaying means when the temperature sensed by said sensor is above said first threshold and third activating means for activating said third displaying means when the temperature sensed by said sensor is above said second threshold.

13. The device of claim 12, wherein said first activating means is operative to deactivate said first displaying means when the temperature sensed by said sensor is above said first threshold; and wherein said second activating means is operative to deactivate said second displaying means when the temperature sensed by said sensor is above said second threshold.

14. The device of claim 13, wherein said sensor has first and second outputs, said first activating means including a NOR-gate having first and second inputs and an output, said first and second inputs of said NOR-gate being connected to said first and second outputs, respectively, of said sensor, said output of said NOR-gate being connected to said first displaying means.

15. The device of claim 14, wherein said second activating means includes a buffer and a first XOR gate, said buffer having first and second inputs and an output, said first input of said buffer being connected to said first input of said NOR-gate and to said first output of said sensor, said second input of said buffer being connected to said second input of said NOR-gate and to said second output of said sensor, said first XOR gate having first and second inputs and an output, said first input of said first XOR gate being connected to said output of said buffer, said output of said first XOR gate being connected to said second displaying means.

16. The device of claim 15, wherein said third activating means includes a second XOR gate having first and second inputs and an output, said first input of said second XOR gate being connected to said second output of said temperature sensor, said second input of said second XOR gate being connected to said second input of said first XOR gate, and said output of said second XOR gate being connected to said third displaying means.

17. The device of claim 16, wherein said driver circuit includes enabling means for enabling at least one of said first, second and third activating means during a power-up of said at least one electronic component.

18. The device of claim 17, wherein said enabling means is operative to enable said second and third activating means during the power-up of said at least one electronic component.

19. The device of claim 18, wherein said enabling means includes a second NOR gate having first and second inputs, a ground potential input, and an output, said first input of said second NOR gate being connected to said ground potential input of said second NOR gate, and said output of said second NOR gate being connected to said second input of said first XOR gate and to said second input of said second XOR gate.

20. The device of claim 19, wherein said enabling means includes at least one resistor, which has an output connected to said second input of said second NOR gate, and at least one capacitor, which has an input connected to said second input of said second NOR gate.

21. The device of claim 12, further comprising enabling means for enabling at least one of said first, second and third activating means during a power-up of said at least one electronic component.

22. The device of claim 21, wherein said enabling means enables said second and third activating means during the power-up of said at least one electronic component.

23. An electronic device comprising at least one electronic component, said at least one electronic component including at least one memory circuit for storing data therein; a temperature sensor located adjacent said at least one electronic component for sensing a temperature condition of said at least one electronic component; a display for electronically displaying the temperature condition sensed by said sensor, said at least one electronic component, said sensor and said display being integrated with one another as a single, self-contained module; monitoring means for monitoring the extent to which said at least one memory circuit is accessed, said monitoring means including generating means for generating an electrical signal representative of a count which corresponds to the number of times said at least one memory circuit is accessed; and displaying means for displaying the extent monitored by said monitoring means.

24. The device of claim 23, wherein said monitoring means includes resetting means for resetting said count after a predetermined time period.

25. The device of claim 24, wherein said monitoring means includes driving means electrically connected to said displaying means for operating said displaying means.

26. The device of claim 25, further comprising disabling means for disabling said driving means during a power-up of said at least one memory circuit such that said displaying means is disabled during the power-up of said at least one memory circuit.

27. The device of claim 26, wherein said disabling means is operative to disable said generating means during the power-up of said at least one memory circuit.

28. A memory device for storing data therein, comprising at least one solid state memory circuit; a temperature sensor located adjacent said at least one solid state memory circuit for sensing a temperature condition of said at least one solid state memory circuit; a display for electronically displaying the temperature condition sensed by said sensor; and a printed circuit board, said at least one solid state memory circuit, said sensor and said display being integrated on said printed circuit board as a single, self-contained module.

29. The device of claim 28, further comprising a driver circuit for receiving and processing an electrical signal transmitted from said sensor so as to operate said display, said driver circuit being integrated with said at least one solid state memory circuit, said sensor, and said display so as to form said module.

30. The device of claim 28, further comprising monitoring means for monitoring the extent to which said at least one solid state memory circuit is accessed and displaying means for displaying the extent monitored by said monitoring means.

31. A memory device for storing data therein, comprising at least one memory circuit; a temperature sensor located adjacent said at least one memory circuit for sensing a temperature condition of said at least one memory circuit; a display for electronically displaying the temperature condition sensed by said sensor; and a driver circuit for receiving and processing an electrical signal transmitted from said sensor so as to operate said display, said driver circuit, said at least one memory circuit, said sensor, and said display being integrated as a single, self-contained module wherein said display includes first displaying means for displaying a first temperature condition of said at least one memory circuit when the temperature sensed by said sensor is below a first temperature threshold, second displaying means for displaying a second temperature condition of said at least one memory circuit when the temperature sensed by said sensor is above said first temperature threshold, and third displaying means for displaying a third temperature condition of said at least one memory circuit when the temperature sensed by said sensor is above a second temperature threshold, which is greater than said first temperature threshold.

32. The device of claim 31, wherein said driver circuit includes first activating means for activating said first displaying means when the temperature sensed by said sensor is below said first threshold, second activating means for activating said second displaying means when the temperature sensed by said sensor is above said first threshold and third activating means for activating said third displaying means when the temperature sensed by said sensor is above said second threshold.

33. The device of claim 32, wherein said first activating means is operative to deactivate said first displaying means when the temperature sensed by said sensor is above said first threshold; and wherein said second activating means is operative to deactivate said second displaying means when the temperature sensed by said sensor is above said second threshold.

34. The device of claim 33, wherein said driver circuit includes enabling means for enabling said second and third activating means during a power-up of said at least one electronic component.

35. An electronic device comprising at least one electronic component; a temperature sensor located adjacent said at least one electronic component for sensing a temperature condition of said at least one electronic component; and a display for electronically displaying the temperature condition sensed by said sensor, said display including first display means for displaying a first temperature condition of said at least one electronic component when the temperature sensed by said sensor is below a first temperature threshold, said display including second displaying means for displaying a second temperature condition of said at least one electronic component when the temperature sensed by said sensor is above said first temperature threshold, said at least one electronic component, said sensor, and said display being integrated with one another as a single, self-contained module.

36. The device of claim 35, wherein said display includes third display means for displaying a third temperature condition of said at least one electronic component when the temperature sensed by said sensor is above a second temperature threshold, which is greater than said first temperature threshold.

37. The device of claim 36, wherein each of said first, second, and third displaying means includes at least one light emitting diode.

* * * * *